US008803614B2

(12) United States Patent
Giammello et al.

(10) Patent No.: US 8,803,614 B2
(45) Date of Patent: Aug. 12, 2014

(54) CURRENT REUSE ELECTRONIC DEVICE BASED ON MAGNETIC COUPLING COMPONENTS

(75) Inventors: Vittorio Giammello, Catania (IT);
Egidio Ragonese, Aci Catena (IT);
Giuseppe Palmisano, S. Giovanni La Punta (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 13/604,443

(22) Filed: Sep. 5, 2012

(65) Prior Publication Data

US 2013/0113562 A1 May 9, 2013

(30) Foreign Application Priority Data

Sep. 9, 2011 (IT) .............................. MI2011A1632

(51) Int. Cl.
*H03F 3/191* (2006.01)
*H03F 1/22* (2006.01)

(52) U.S. Cl.
USPC ......................................... 330/302; 330/311

(58) Field of Classification Search
CPC ......... H03F 3/191; H03F 3/193; H03F 3/195; H03F 2200/534; H03F 2200/537; H03F 2200/541; H03F 3/45; H03F 1/22
USPC .......... 330/165, 188, 195, 300, 310, 311, 302
See application file for complete search history.

(56) References Cited

U.S. PATENT DOCUMENTS

| 5,450,038 | A * | 9/1995 | Rydel ........................... 330/310 |
| 6,744,322 | B1 * | 6/2004 | Ma et al. ....................... 330/300 |
| 7,113,045 | B2 * | 9/2006 | Westwick et al. ............. 330/301 |
| 7,315,212 | B2 * | 1/2008 | Floyd et al. ................... 330/305 |
| 2003/0141953 | A1 | 7/2003 | Haslett et al. |
| 2011/0181363 | A1 | 7/2011 | Anegawa et al. |

FOREIGN PATENT DOCUMENTS

EP 2 037 572 A1 5/2011
KR 20110051124 A 5/2011

OTHER PUBLICATIONS

Italian Search Report and Written Opinion dated Apr. 17, 2012 from corresponding Italian Application No. MI2011A001632.
Cha, C-Y. Lee, S-G. "A low power, high gain LNA topology," in ICMT 2000, pp. 420-423.
G. Gramegna, A. Magliarisi, M. Paparo, "An 8.2-GHz, 14.4mW, 1.6dB NF SiGe bipolar LNA with DC current reuse," in BCTM 2003, pp. 49-52.
Walling, J. S. Shekhar, S. and Allstot, D. J. "A gm-boosted current-reuse LNA in 0.18μm CMOS," in RFIC 2007, pp. 613-617.

(Continued)

*Primary Examiner* — Steven J Mottola
(74) *Attorney, Agent, or Firm* — Wolf, Greenfield & Sacks, P.C.

(57) ABSTRACT

A current reuse device including a first stage provided with a first input for a first input signal and a first output for a first output signal; a second stage comprising a second input for a second input signal and a direct current terminal operating as a ground terminal for alternate signals; a first inductor connected to a first output and to the direct current terminal so that the first and second stages share a direct current; a second inductor reciprocally coupled to the first inductor and connected to the second input in order to generate the second input signal as a function of the first output signal.

27 Claims, 7 Drawing Sheets

(56) References Cited

OTHER PUBLICATIONS

Cha, C-Y. Lee, S-G, "A 5.2-GHz LNA in 0.35-μm CMOS utilizing inter-stage series resonance," IEEE JSSC 2003, pp. 669-672.

Liao C-H., and Chuang, H-R. "A 5.7-GHz 0.18-μm CMOS gain-controlled differential LNA with current reuse for WLAN receiver," IEEE MWCL 2003, pp. 526-528.

Kuo, C.-C. and Wang, H. "A 24-GHz low power low noise amplifier using current reuse and body forward bias techniques in 0.18-μm CMOS technology," IEEE APMC 2010, pp. 1509-1511.

Zheng, L. Yao, H-C., Tzeng, F., and Heydari, P. "Design and analysis of a current-reuse transmitter for ultra-low power applications," IEEE ISCAS 2009, pp. 1317-1320.

J.F. Long, "Monolithic transformers for silicon RF IC design," IEEE J., Solid State Circuits, vol. 35, Sep. 2000, pp. 1368-1382.

* cited by examiner

CURRENT REUSE ELECTRONIC DEVICE BASED ON MAGNETIC COUPLING COMPONENTS

CROSS REFERENCE TO RELATED APPLICATIONS

This application claims the priority benefit of Italian patent application number MI2011A001632, filed on Sep. 9, 2011, which is hereby incorporated by reference to the maximum extent allowable by law.

BACKGROUND

1. Technical Field

The present disclosure refers to the field of electronic circuits using the current reuse technique.

2. Discussion of the Related Art

The necessity of obtaining higher gains while reducing absorbed power has led to the design of different kinds of multi-stage amplifiers based on the direct current reuse principle. These approaches, which are generally referred as "current reuse" techniques, substantially consist of two main types: capacitive coupling techniques and resonant series inter-stage LC networks.

The following reviews refer to the capacitive coupling technique:

- C-Y. Cha, S-G. Lee, "A low power, high gain LNA topology," in ICMT 2000, pages 49-52.
- G. Gramegna, A. Magliarisi, M. Paparo, "An 8.2-GHz, 14.4 mW, 1.6 dB NF SiGe bipolar LNA with DC current reuse," in BCTM 2003, pages 49-52.
- J. S. Walling, S. Shekhar and D. J. Allstot, "A gm-boosted current-reuse LNA in 0.18 μm CMOS," in RFIC 2007, pages 613-617.

For example, the paper "A low power, high gain LNA topology" Y. Cha, S-G. Lee shows a first MOSFET transistor having its drain connected to the gate of a second MOSFET transistor by a coupling capacitor. The first transistor drain is also connected to the second transistor source by an inductor. The coupling for the radiofrequency signal between the first and second transistors is ensured by the coupling capacitor. Further, a decoupling capacitor is connected across the second transistor source and the ground and operates as a bypass for the radiofrequency signal and as an open circuit for the direct current, for ensuring in this way the current reuse between the two transistors. The path for the direct current is as the path of a cascode amplifier, while the path for the RF signal is as the one of a common source two stage amplifier having an inductive load.

It is to be observed that this technique is adapted for frequencies lower than a GHz, due to the presence of parasitic capacities in the first transistor drain, which result in a radiofrequency signal partition and in an inefficient transfer to the second transistor.

The following reviews refer to the current reuse technique with resonant series inter-stage LC networks:

- C-Y. Cha, S-G. Lee, "A 5.2-GHz LNA in 0.35-μm CMOS utilizing inter-stage series resonance," IEEE JSSC 2003, pages 669-672.
- C-H. Liao, and H-R. Chuang, "A 5.7-GHz 0.18-μm CMOS gain-controlled differential LNA with current reuse for WLAN receiver," IEEE MWCL 2003, pages 526-528.

The paper "A 5.2-GHz LNA in 0.35-μm CMOS utilizing inter-stage series resonance", C-Y. Cha, S-G. Lee describes a circuit analogous to the above mentioned one, wherein, however, the RF signal coupling between the two cascade stages is obtained by a LC network. In this case, the inductor and capacitor are sized to obtain a series resonance for the RF signal, in order to obtain a low impedance at the operative frequency and improve the signal transfer between the transistors. This technique enables absorption of the parasitic capacities and therefore is adapted to operate also at frequencies of several GHz. Despite this fact, the improvement with respect to the capacitive coupling technique, with reference to the RF signal transfer, is obtained by a circuit having an additional component, that is the inductor of the LC network.

It is also observed that the described techniques can be adopted for multi-stage differential amplifiers, but in this case, the number of reactive components doubles with a consequent increase of the chip area in which the circuit is integrated and therefore of the manufacturing cost.

SUMMARY

The Applicant has observed that there is the need to provide current reuse techniques adapted to a higher frequency band, hardly obtainable by the capacitive coupling technique, by avoiding at the same time the disadvantages regarding the area occupied by the integrated components which impair the resonant series inter-stage LC network technique.

According to one embodiment, there is provided an electronic device comprising: a first stage provided with a first input for a first input signal, and a first output for a first output signal; a second stage comprising a second input for a second input signal, a direct current terminal operating as a ground terminal for alternate current signals, and a second output for a second output signal; a first inductor connected to the first output and direct current terminal so that the first and second stages share a continuous current; and a second inductor mutually coupled to the first inductor and connected to the second input in order to output the second input signal as a function of the first output signal.

According to another embodiment, at least said first stage has a single-ended configuration.

According to another embodiment, the device further comprises a decoupling capacitor connected across a ground terminal and the direct current terminal.

According to another embodiment, the at least one first stage has a differential configuration, and wherein the first output comprises a pair of output terminals; the first inductor is connected across the output terminals pair and is provided with a central symmetry point acting as a virtual ground terminal for alternate current signals; and the direct current terminal is connected to the virtual ground terminal.

According to another embodiment, the second stage has a differential configuration, and wherein: the second input comprises a pair of input terminals; and the second inductor is connected across the pair of input terminals.

According to another embodiment, the device is a multi-stage amplifier and the first and the second stages have corresponding amplifier stages.

According to another embodiment, at least one of the first and second stages is an amplifier with a MOSFET technology having one of the following configurations: common source, cascode, common gate; or at least one of the first and second stages is an amplifier with a BJT technology having one of the following configurations: common emitter, cascode, common base.

According to another embodiment, the first and the second inductors are sized and adjusted for resonantly operating.

According to another embodiment, the device is at least partially made by integration in a chip of a semiconductor material, and the first and second reciprocally connected inductors form an integrated transformer.

According to another embodiment, the first and second stages, the first and second inductors, are sized for operating on said first input signal at radiofrequencies or at the frequencies of millimeter waves.

According to another embodiment, said device is a wireless signal transmitter, and the first stage comprises a voltage-controlled oscillator, the second stage comprises a power amplifier.

According to another embodiment, said device is a wireless signal receiver, and the first and second stages form a low noise amplifier.

According to another embodiment, at least a third stage comprising a third input for a third input signal and a further direct current terminal operating as a ground terminal for alternate current signals; a third inductor connected to the second output and to the further direct current terminal so that the second stage and the at least one third stage share the direct current; and a fourth inductor reciprocally coupled to the third inductor and connected to the third input in order to output the third input signal as a function of the second output signal.

According to another embodiment, the device further comprises an input transformer connected to the first input of the first stage for supplying the first input signal from an input signal; and an output transformer connected to the second output of the second stage for supplying an output signal from the second output signal.

BRIEF DESCRIPTION OF THE DRAWINGS

To better understand the embodiments and appreciate various advantages in the following some of its exemplifying non-limiting embodiments will be described with reference to the attached figures, wherein.

DETAILED DESCRIPTION

Figure 1:
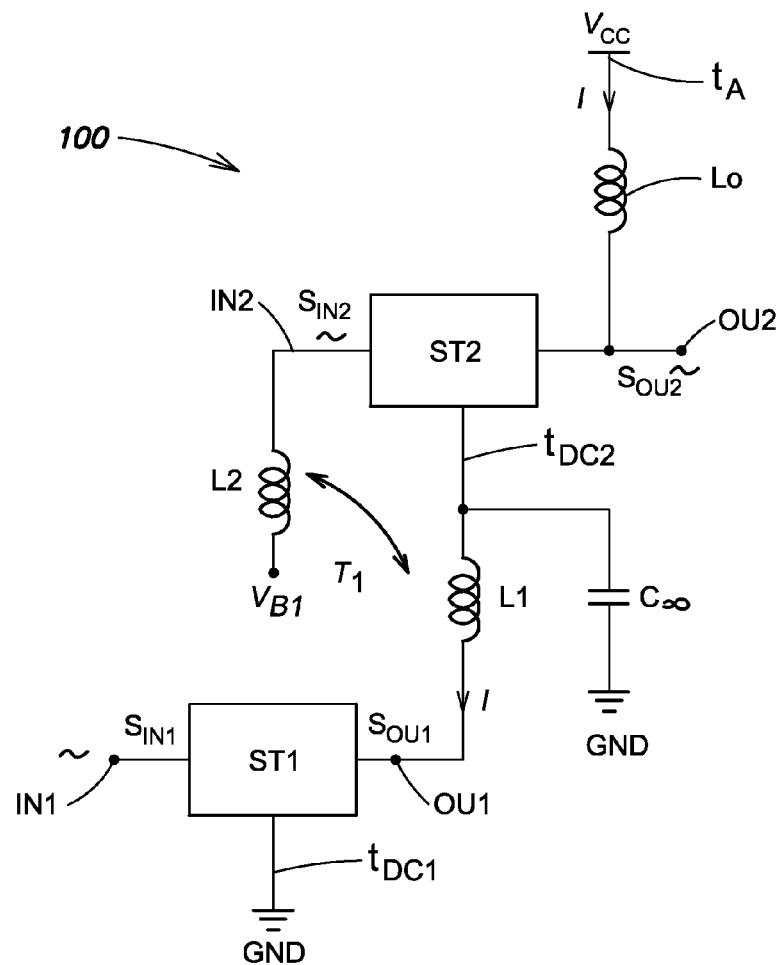
FIG. 1 shows a first current reuse electric device according to an embodiment of the single-ended type.

FIG. 1 shows a first electric current reuse device 100, according to a particular embodiment, comprising a first electronic stage ST1 and a second electronic stage ST2. The first electronic stage ST1 and the second electronic stage ST2 are, according to this embodiment, single-ended stages.

The first electric device 100 is used, for example, in the telecommunications field in a wireless signal transmitter and/or receiver operating on radiofrequency signals (on the order of gigahertz) and, more particularly, at millimeter-wave frequencies. As is known, the millimeter-waves frequencies fall in the following range of 30 GHz-300 GHz.

More particularly, the first electronic stage ST1 is provided with a first input terminal IN1 for a first input signal $S_{IN1}$, first output terminal OU1 for a first output signal $S_{OU1}$ and a first direct current terminal $t_{DC1}$ connected to a ground terminal GND.

The second electronic stage ST2 is provided with a second input terminal IN2, a second output terminal OU2 for a second output signal $S_{OU2}$ and a second direct current terminal $t_{DC2}$. The second output terminal OU2 is connected to a supply terminal $t_A$ for a supply voltage Vcc by, for example, an output inductor Lo, from which it receives a direct current I. The output inductor Lo acts as an inductive load for the second electronic stage ST2.

The first output terminal OU1 is connected to a first coupling inductor L1, also connected to the second direct current terminal $t_{DC2}$. The second direct current terminal $t_{DC2}$ is alternating current decoupled by the first output signal OU1. According to the example shown in FIG. 1, the current decoupling is obtained by a decoupling capacitor $C_\infty$ having a terminal connected to ground GND and another terminal between the first coupling inductor L1 and the second direct current terminal $t_{DC2}$. The decoupling capacitor $C_\infty$ capacity is chosen to obtain a capacitive impedance so that the alternating current component of the first output signal $S_{OU1}$ is substantially discharged to the ground GND. Further, the decoupling capacitor $C_\infty$ is sized to substantially represent an open circuit for the continuous current.

The first electric device 100 is also provided with a second coupling inductor L2 connected to the second input terminal IN2 of the second electronic stage ST2. The first coupling inductor L1 is mutually coupled to the second coupling inductor L2. Such mutual coupling enables generation, at the second input terminal IN2 of the second electronic stage ST2, a second alternating current input signal $S_{IN2}$ which depends on the first output signal $S_{OU1}$. Specifically, the first and second coupling inductors L1 and L2 can be implemented in order to form a first transformer T1.

The electric device 100 is implementable, particularly, by integration on a semiconductor material chip such, for example, of silicon. In this case, the first transformer T1 can be a transformer integrated by techniques known to the person skilled in the art, which provide interleaved or stacked metallization arrangements. The paper "Monolithic transformers for silicon RF IC design," J. F. Long IEEE J., Solid State Circuits, vol. 35, September 2000, pages 1368-1382, provides information about the main techniques of implementing integrated transformers.

It is observed that, by such integration techniques, the first transformer T1 occupies an area on the silicon chip substantially equal to the area which the only first inductor L1 would occupy.

A coupling coefficient k is associated to the first transformer T1 which is:

$$k = \sqrt{L_P \cdot L_S}$$

wherein, $L_p$ is the inductance of the first coupling inductor L1 and $L_s$ is the inductance of the second coupling inductor L2.

The first transformer T1 can be sized in order to resonantly operate by having a resonance at the operative frequency with all the capacities parallelly arranged, in order to maximize the coupling coefficient k and reduce the insertion losses.

The electric device 100 is, according to an example, a multi-stage amplifier device such as, particularly, a power amplifier or a low noise amplifier, LNA, which can be used in receiver devices in the telecommunications field. In such case, the first stage ST1 and second stage ST2 are respective amplifier stages.

It is observed that the first electric device 100 can perform other operations besides amplification. According to another example, the first electric device 100 can be used in a radiofrequency transmitter and first stage ST1 is a voltage controlled oscillator VCO, while the second stage ST2 is a power amplifier of the signal exiting the first stage ST1.

According to a further example, the first electric device 100 is useable in a radiofrequency or millimeter-wave receiver, wherein the first stage ST1 operates as a low noise amplifier (LNA) and the second stage ST2 operates as a mixer.

With reference to the operation, firstly the path regarding the alternating current signal is considered. The first input signal $S_{IN1}$, for example a radiofrequency signal, is applied to the first input IN1 of the first electronic stage ST1 which operates on the signal itself, according to its function, returning the first output signal $S_{OU1}$.

The first output signal $S_{OU1}$ through the first coupling inductor L1 results in a magnetic field flow concatenated to the second coupling inductor L2. After this magnetic coupling, in the second coupling inductor L2, the second input signal $S_{IN2}$ (an alternating current signal and, according to the example, a radiofrequency signal) is generated, which is supplied to the second input IN2 of the second electronic stage ST2. A biasing voltage $V_{B1}$ at the second electronic stage ST2 is supplied to the second coupling inductor L2 and therefore to the second input terminal IN2, and is, for the alternating current signal, a ground reference.

It is observed that the second input signal $S_{IN2}$ has the same information content as the first output signal $S_{OU1}$. The second input signal $S_{IN2}$ crosses the second electronic stage ST2 which, according to its operation, generates the second output signal $S_{OU2}$ available at the second output terminal OU2.

The current associated with the first output signal $S_{OU1}$ after flowing through the first coupling inductor L1 is short-circuited to the ground terminal by the decoupling capacitor $C_\infty$. Therefore, the capacitor $C_\infty$ ensures the ground reference for the alternate signal of the second electronic stage ST2.

The direct current I flowing through the output inductor Lo is supplied to the second electronic stage ST2, through the second output port OU2 and is collected at the second direct current terminal $t_{DC2}$.

Therefore, the direct current I flows through the first coupling inductor L1 and, by the first output terminal OU1 enters the first electronic stage ST1 and flows to the ground terminal GND, performing therefore a direct current reuse and in other words this current is shared between the first electronic stage ST1 and the second electronic stage ST2.

The first electric device 100, when implemented in a semiconductor material chip, can be implemented by the MOSFET (Metal Oxide Semiconductor Field Effect Transistor) technology or the BJT (Bipolar Junction Transistor) technology as well as a hybrid implementation or by discrete components.

Moreover, it is observed that the first electronic device 100 can comprise not just two electronic stages, but a plurality of electronic stages which share the direct current and each has an output coupled with the input of the next electronic stage, if present, by an associated coupling transformer, as clearly shown in FIG. 1.

In the following description, similar or like devices or components are indicated in the figures by like numerical references.

Figure 2:
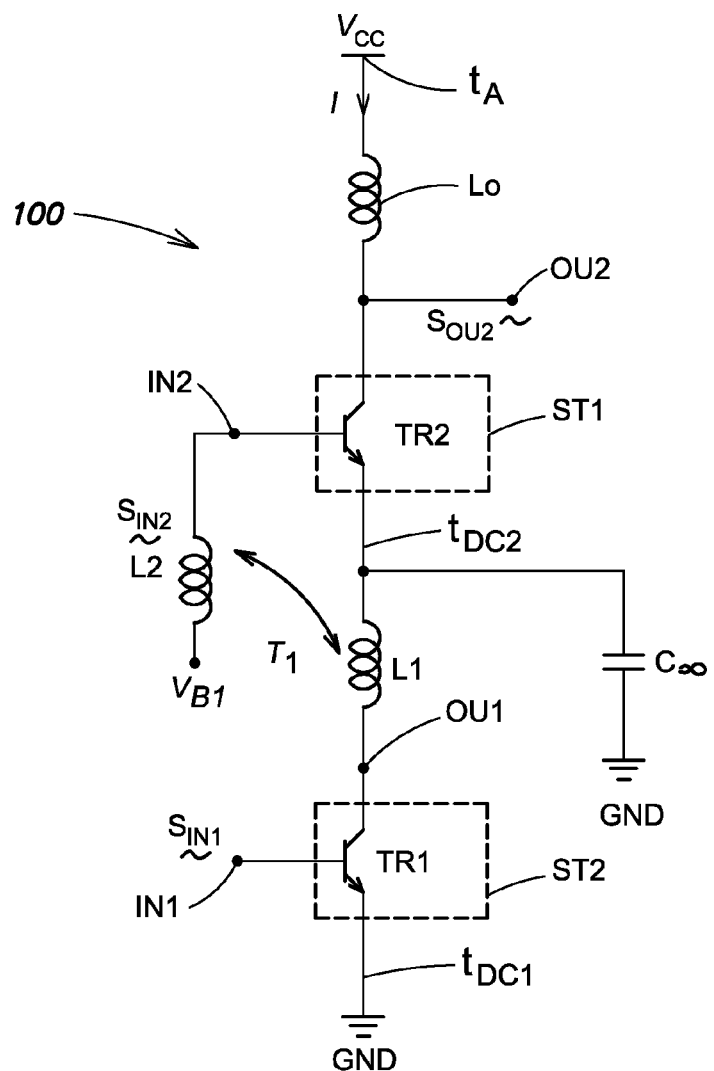
FIG. 2 shows the first electric device according to a first embodiment regarding a two stage amplifier.

FIG. 2 shows a second embodiment of the first electronic device 100 regarding a specific case wherein the first electronic stage ST1 and the second electronic stage ST2 are single-ended type amplifier stages and implemented by the BJT technology.

More particularly, the first amplifier stage ST1 comprises a transistor TR1 and the second amplifier stage ST2 comprises a further transistor TR2. In the example of FIG. 2, transistors TR1 and TR2 are NPN type and are implemented by the BJT technology.

Specifically, for the alternating current signal, the transistor TR1 (having a common emitter configuration) and the further transistor TR2 (having a common emitter configuration) are two cascade amplifier stages having an inductive load, represented by the first inductor L1 and by the output inductor Lo for the first and second electronic stages ST1 and ST2, respectively. For the direct current I, the first electronic device 100 of FIG. 2 is an amplifier having a cascode configuration having, particularly, the transistor TR1 with a common emitter configuration and the further transistor TR2 with a common base configuration.

Figure 3:
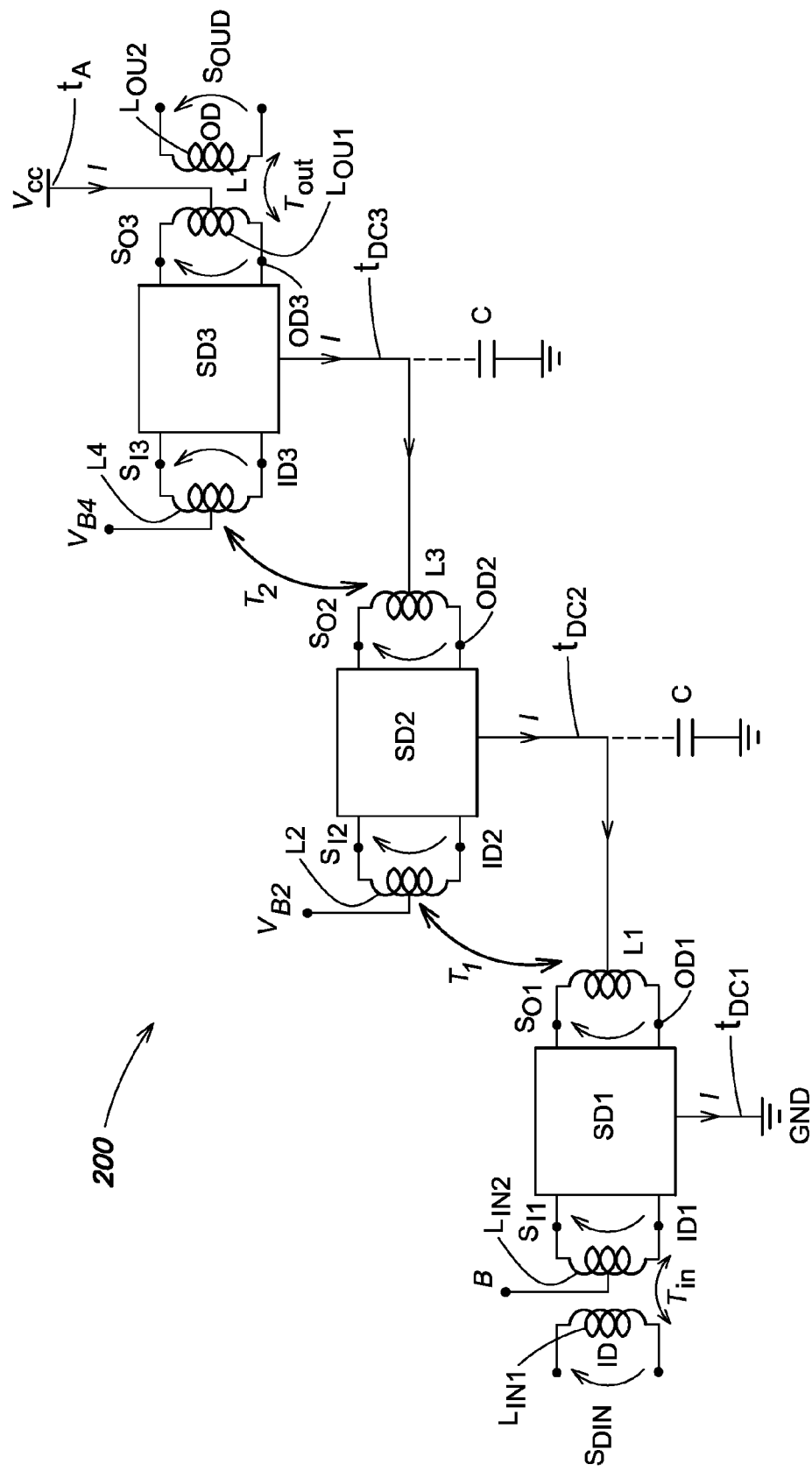
FIG. 3 shows a second electric device according to an embodiment of the differential type.

FIG. 3 shows a second electric device 200 of the current reuse type, according to a particular embodiment. The second electric device 200 is analogous to the device 100 described with reference to FIG. 1, except that it has a differential configuration instead of a single-ended one.

The second electric device 200 of FIG. 3 comprises: a first differential electronic stage SD1, a second differential electronic stage SD2 and a third differential electronic stage SD3. As an alternative to what is shown in FIG. 3, the second differential electronic device 200 can comprise just two differential electronic stages or a number of differential electronic stages greater than three.

Analogously to what was stated with reference to FIG. 1, the second electronic device 200 can be a multi-stage amplifier or can be another type of device useable, for example, in the telecommunication field, such as a transmitter block or a receiver block.

More particularly, the first differential electronic stage SD1 is provided with: a first differential input ID1 for a first differential input signal $S_{I1}$ (typically a voltage), a first differential output OD1 for a first differential output signal $S_{O1}$, and the first direct current terminal $t_{DC1}$ connected to the ground terminal GND.

The second differential electronic stage SD2 is provided with: a second differential input ID2 for a second differential input signal $S_{I2}$ (typically a voltage), and a second differential output OD2 for a second differential output signal $S_{O2}$.

The third differential electronic stage SD3 is provided with: a third differential input ID3 for a third differential input signal $S_{I3}$, a third differential output OD3 for a third differential output signal $S_{O3}$. Each differential input ID1-ID3 and each differential output OD1-OD3 comprises a pair of respective terminals.

The corresponding first coupling inductor L1 is connected across the terminals pair of the first differential output OD1, such to obtain a mutual coupling with the second coupling inductor L2 connected across the terminals of the second differential input ID2.

Further, the second differential electronic stage SD2 is provided with the second direct current terminal $t_{DC2}$ for the direct current I, which acts as a ground terminal for alternating current signals. Particularly, the second direct current terminal $t_{DC2}$ is connected to the first coupling inductor L1 at a virtual ground point for the signal, wherein in other words the alternating voltage takes a value equal to zero. More particularly, such virtual ground point is substantially a central point of the first inductor L1 winding.

In FIG. 3, to the virtual ground point is connected a first symbolic decoupling capacitor C connected across the ground terminal GND and the second direct current terminal $t_{DC2}$. By using transformers integrated in a chip (made with the stacked or interleaved technology) of the type having a differential symmetrical structure, the central point is accessible by a bottom metallization layer, meanwhile obtaining the desired turns ratio.

A third coupling inductor L3 is connected across the pair of terminals of the second differential output OD2, so as to implement a mutual coupling with a fourth coupling inductor L4, connected between the pair of terminals of the third differential input ID3. The third coupling inductor L3, and the fourth coupling inductor L4 can be implemented by a second transformer T2. The second transformer T2, analogously implementable in the same manner as the first transformer T1, advantageously can operate resonantly.

The third differential electronic stage SD3 is provided with a third direct current terminal $t_{DC3}$, for the direct current I, which operates as a ground terminal for alternating current signals. Particularly, the third direct current terminal $t_{DC3}$ is connected to the third coupling inductor L3 at a virtual ground point for the alternating voltage.

More particularly, such virtual ground point is substantially a central point of the winding of the third inductor L3. Analogously to what has been described with reference to the first coupling inductor L1, also for the third coupling inductor L3, the virtual ground point is connected to a second symbolic decoupling capacitor C, connected across the ground terminal GND and the third direct current terminal $t_{DC3}$. It is observed that, despite the presence of said symbolic capacitors C, it is not necessary, thanks to the virtual ground node's properties, to exclude the use of corresponding real decoupling capacitors for strengthening the virtual ground effect.

According to the particular embodiment shown in FIG. 3, the first differential input ID1 is connected to an optional input transformer Tin comprising: a first input inductor $L_{IN1}$, for a differential input signal $S_{DIN}$ and a second input inductor $L_{IN2}$ connected across the pair of terminals of the first differential input ID1. The first input inductor $L_{IN1}$ defines, across it, a differential input ID.

Further, according to a particular embodiment shown in FIG. 3, the third differential output OD3 is connected to an optional output transformer Tout comprising: a first output inductor $L_{OU1}$, connected across the pair of terminals of the third differential output OD3, and a second output inductor $L_{OU2}$, defining across it a differential output OD, for a differential output signal $S_{OUD}$.

The optional input transformer Tin and output transformer Tout are used for converting the differential signal to a single-ended signal, when the application requires a single terminal input and/or output. Further, the use of transformers Tin and Tout inherently provides the protection against the electrostatic discharges (known as ESD protection).

According to the embodiment of FIG. 3, the supply terminal $t_A$ to which is applied the supply voltage Vcc, is connected to the central point of the first output inductor $L_{OU1}$, which forms a virtual ground point for the alternating voltage.

The second input inductor $L_{IN2}$, the second coupling inductor L2 and the fourth coupling inductor L4 are biased at a respective biasing voltage $V_B$, $V_{B2}$ and $V_{B4}$ applied to a corresponding central point of each winding.

The operation of the second electric device 200 of FIG. 3 is analogous to the operation of the first electric device of FIG. 1. Firstly, the path regarding an alternating voltage signal is considered. The input alternating voltage signal $S_{DIN}$, for example, a radiofrequency or millimeter-wave frequency signal, is applied at the differential input ID and therefore, by the input transformer Tin, is applied to the first differential electronic stage SD1 operating on the signal and providing the first differential output signal $S_{O1}$.

Therefore, the first differential output signal $S_{O1}$, applied across the first coupling inductor L1, generates a magnetic field flow concatenating to the second coupling inductor L2. Due to this magnetic coupling, the second differential input signal $S_{I2}$ is generated in the second coupling inductor L2, which is then supplied to the second differential input ID2 of the second differential electronic stage SD2.

The second differential electronic stage SD2 supplies the second differential output signal $S_{O2}$ which is applied across the third coupling inductor L3 and therefore, by the magnetic coupling with the fourth coupling inductor L4, the third differential input signal $S_{I3}$ is applied to the third differential input of the third differential electronic stage SD3.

The third differential electronic stage SD3 supplies the third differential output $S_{O3}$ at the third differential output OD3, which by the output transformer Tout flows to the differential output OD, as a differential output signal $S_{OUD}$.

The respective alternating current components, present in the first differential output signal $S_{O1}$, in the second differential output signal $S_{O2}$ and in the third differential output signal $S_{O3}$ do not flow to the second direct current terminal $t_{DC2}$, to the third direct current terminal $t_{DC3}$ and to the terminal for the supply voltage Vcc, because these terminals are connected to virtual ground points for the alternating current of the corresponding inductors.

The direct current I, which by the first output inductor $L_{OU1}$ flows to the third electronic stage SD3, is collected at the third direct current terminal $t_{DC3}$ of the third differential electronic stage SD3. Such direct current I is supplied to the second differential electronic stage SD2 through the third coupling inductor L3 and therefore appears at the second direct current terminal $t_{DC2}$, connected to the first electronic differential stage SD1 by the first coupling inductor L1. The direct current I flows through the first differential electronic stage SD1 and to the first direct current terminal $t_{DC1}$ and therefore to the ground terminal GND. Therefore, there is a direct current reuse for the second electric device 200 and in other words, this current is shared between the first, second, and third differential electronic stages SD1, SD2 and SD3.

In the following, some embodiments of the second electronic device 200 will be described with reference to specific examples of BJT-technology multi-stage amplifiers.

Figure 4:
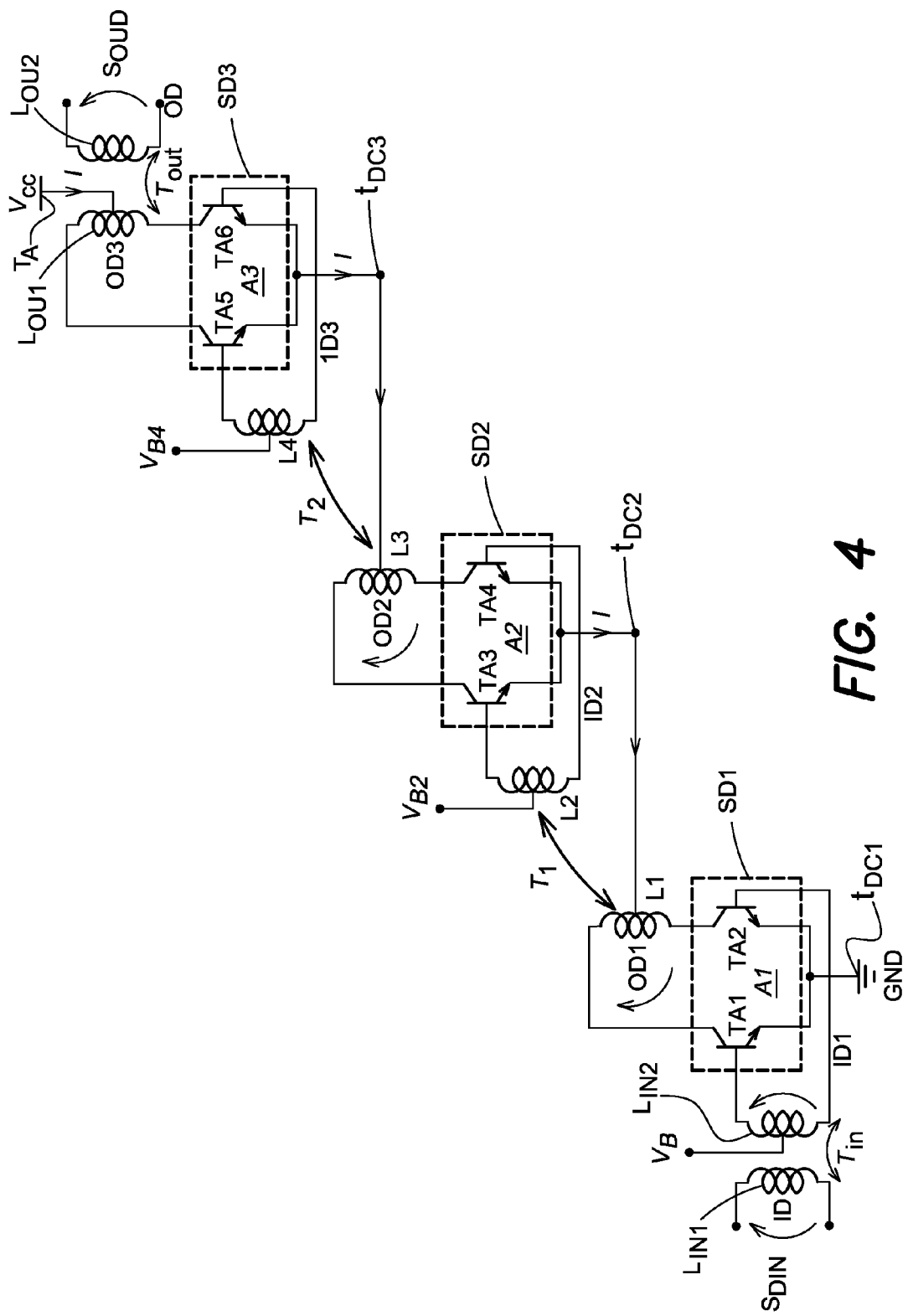
FIG. 4 shows the second electric device in a first embodiment comprising three cascade common emitter amplifier stages.

FIG. 4 refers to a first embodiment of the second electric device 200 comprising three amplifier stages having a cascade differential configuration.

More specifically, the first, second, and third differential electronic stages SD1, SD2 and SD3 comprise first, second, and third differential amplifiers A1, A2 and A3 respectively. The first differential amplifier A1 comprises a first transistor TA1 and a second transistor TA2, coupled-emitter connected; the second differential amplifier A2 comprises a third transistor TA3 and a fourth transistor TA4, coupled-emitter connected; the third differential amplifier A3 comprises a fifth transistor TA5 and a sixth transistor TA6 coupled-emitter connected.

The first coupling inductor L1 is connected across the collector of the first transistor TA1, and the collector of the second transistor TA2. The emitters of the first and second transistors TA1, TA2 are connected to the first direct current terminal $t_{DC1}$, which is the same as the ground terminal GND. The second input inductor $L_{IN2}$ is connected across the base terminals of the first and second transistors TA1, TA2.

The second coupling inductor L2 is connected across the base terminals of the third and fourth transistors TA3 and TA4 having the respective emitter terminals connected to the second direct current terminal $t_{DC2}$, which is the same as the virtual ground point. The third coupling inductor L3 is connected across the collector of the third transistor TA3 and the collector of the fourth transistor TA4.

The fourth coupling inductor L4 is connected across the base terminals of the fifth and sixth transistors TA5 and TA6, having the respective emitter terminals connected to the third direct current terminal $t_{DC3}$, which is the same as the virtual ground point. The first output inductor $L_{OU1}$ is connected across the collector of the fifth transistor TA4 and the collector of the sixth transistor TA6.

Figure 5:
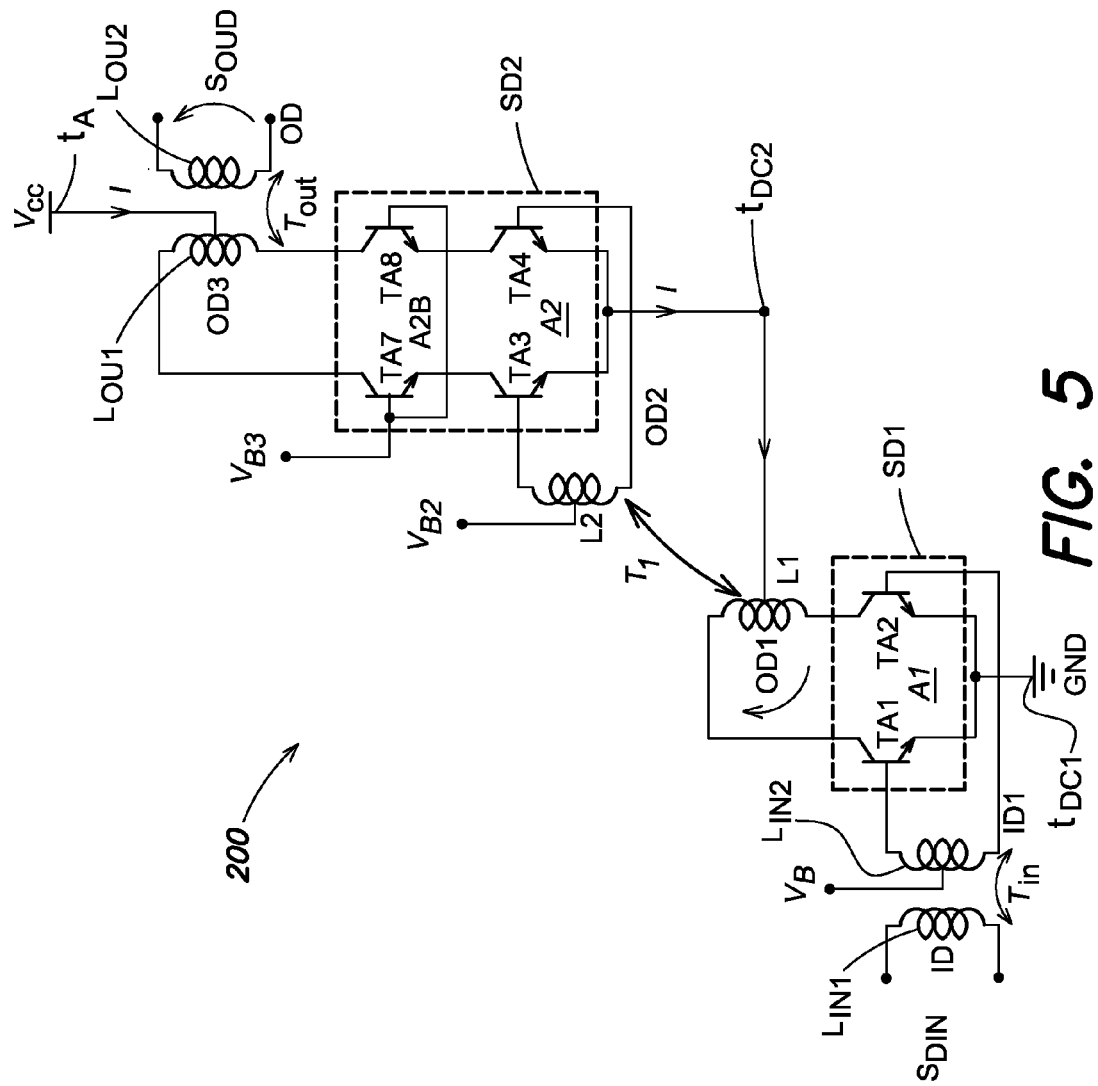
FIG. 5 shows a second embodiment of the second electric device 200 comprising a common emitter amplifier stage and an amplifier stage having a cascode arrangement.

FIG. 5 refers to a second embodiment of the second electric device 200 comprising two amplifier stages having a cascade differential configuration.

More particularly, the first differential electronic stage SD1 of FIG. 5 is analogous to the stage SD1 of FIG. 4 and comprises the first differential amplifier comprising the first and second transistors TA1 and TA2. The first coupling inductor L1 is connected across the collector of the first transistor TA1 and the collector of the second transistor TA2.

The second differential electronic stage SD2 comprises an amplifier having a cascode configuration, including: a differential amplifier having a common emitter configuration A2 (analogous to the second amplifier A2 of FIG. 4) connected in cascade with a differential common base amplifier A2B. The second coupling inductor L2 is connected across the base terminals of the third and fourth transistors TA3 and TA4.

The common base differential amplifier A2B comprises a seventh transistor TA7 and an eighth transistor TA8 having the corresponding emitter terminals connected to corresponding collector terminals of the third and fourth transistors TA3 and TA4. The base terminals of the seventh transistor TA7 and of the eighth transistor TA8 are connected to a corresponding biasing terminal for receiving a suitable biasing voltage $V_{B3}$. The collector terminals of the seventh transistor TA7 and of the eighth transistor TA8 are respectively connected across the first output inductor $L_{OU1}$ of the output transformer Tout.

Figure 6:
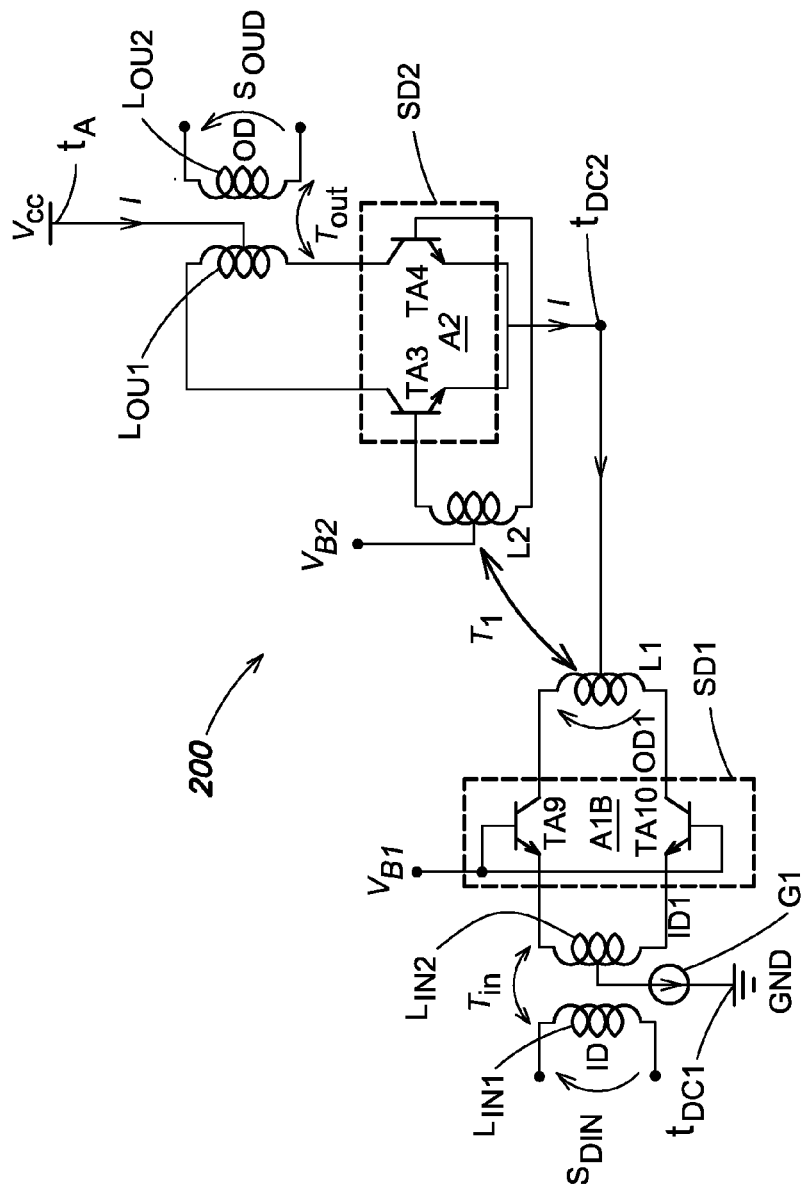
FIG. 6 shows a third embodiment of the second electric device 200 comprising a common base amplifier stage and a common emitter amplifier stage.

FIG. 6 refers to a third embodiment of the second electric device 200 comprising two amplifier stages having a differential cascade configuration. Particularly, the first differential electronic stage SD1 of FIG. 6 comprises a common base amplifier A1B comprising a ninth transistor TA9 and a tenth transistor TA10. The emitter terminals of the ninth and tenth transistors TA9 and TA10 are connected across the second input inductor $L_{IN2}$ which is connected (at its virtual ground for the alternating voltage) to a biasing current generator GI.

The base terminals of the ninth and tenth transistors TA9 and TA10 are connected to another biasing terminal for a corresponding biasing voltage $V_{B1}$. The first coupling inductor L1 is connected across the collector terminals of the ninth and tenth transistors TA9 and TA10.

The second differential electronic stage SD2 comprises a differential amplifier having a common emitter configuration A2 (analogous to the second amplifier A2 of FIG. 4). The first output inductor $L_{OU1}$ is connected across the collector terminals of the third and fourth transistors TA3 and TA4.

Figure 7:
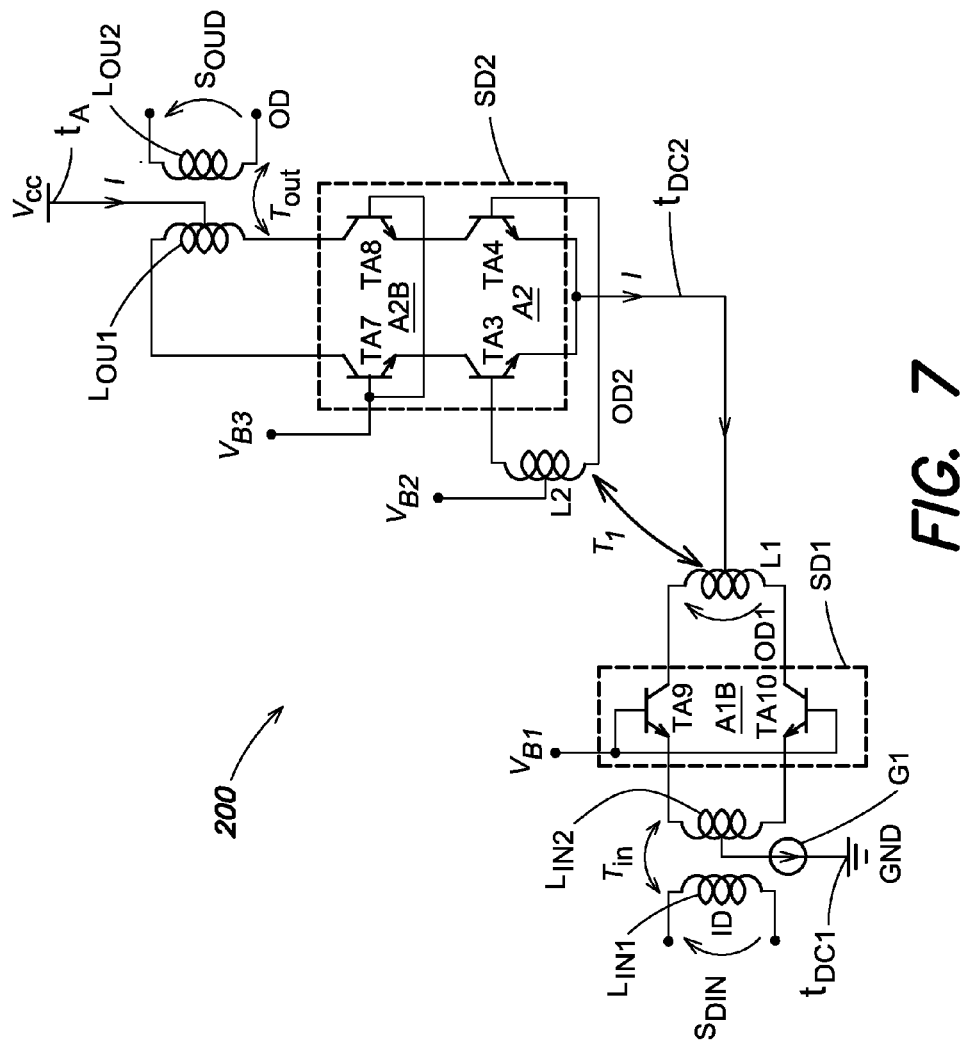
FIG. 7 shows a fourth embodiment of the second electric device 200 comprising a common base amplifier stage and an amplifier stage having a cascode arrangement.

FIG. 7 refers to a fourth embodiment of the second electric device 200 comprising two amplifier stages having a cascade differential configuration. Particularly, the first differential electronic stage SD1 of FIG. 7 comprises a common base amplifier A1B analogous to the amplifier A1B described with reference to FIG. 6. The second differential electronic stage SD2 comprises a cascode configuration amplifier, analogous to the stage SD2 shown and described with reference to FIG. 5.

The person skilled in the art can easily design, using as a reference the preceding description, electronic current reuse devices analogous to the ones shown in FIGS. 1-7, but implemented with the MOSFET technology, for example, common gate, common source and cascode configurations.

According to other embodiments analogous to the first and second electric devices 100 and 200, it is possible to use in the same device, electronic stages having a differential input or output connected to single-ended type electronic stages.

Also the input and output transformers Tin and Tout can be resonant transformers.

As already observed, the use of coupling transformers enables implementation of integrated devices, such as the first and second electric devices 100 and 200, which are based on the current reuse technique without impairing the occupied area with respect to what occurs in the known current reuse devices. Therefore, the described electric devices enable reduction of the power consumption inherent to the current reuse technique, by maintaining the gain performance and improving the efficiency.

It is observed that the differential configuration avoids the use of integrated decoupling capacitors, by implementing a virtual ground, by therefore reducing the number of reactive components to be implemented and avoiding auto-resonance effects at the millimeter-wave frequencies, associated with the integrated capacitors.

Further, the design of the described electric devices is not particularly complicated because only the transformers which are used as a load of the electronic stages require a suitable optimization.

It is observed that the coupling transformers (as for example, the first transformer T1) of the alternating current signal across the output of an electronic stage, and the input of the next stage, act as a resonant load for the gain stages, improving the power gain at the radiofrequencies and millimeter wave frequencies.

The person skilled in the art, in order to meet contingent specific needs, can add several additions, modifications, or substitutions of elements with operatively equivalent other elements to the above described embodiments, without falling out of scope of the attached claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Electronic device comprising:
   a first stage provided with a first input for a first input signal, and a first output for a first output signal;
   a second stage comprising a second input for a second input signal, a direct current terminal operating as a ground terminal for alternating current signals, and a second output for a second output signal;
   a first inductor connected to the first output and the direct current terminal so that the first and second stages share a direct current; and
   a second inductor mutually coupled to the first inductor and connected to the second input in order to output the second input signal as a function of the first output signal, wherein at least the first stage has a differential configuration, and wherein:

the first output comprises a pair of output terminals;

the first inductor is connected across the output terminals pair and is provided with a central symmetry point acting as a virtual ground terminal for the alternating current signals; and the direct current terminal is connected to the virtual ground terminal.

2. Device according to claim 1, further comprising a decoupling capacitor connected across a ground terminal and the direct current terminal.

3. Device according to claim 1, wherein the second stage has a differential configuration, and wherein:

the second input comprises a pair of input terminals; and the second inductor is connected across the pair of input terminals.

4. Device according claim 1, wherein the device is a multistage amplifier and the first and the second stages have corresponding amplifier stages.

5. Device according to claim 4, wherein:

at least one of the first and second stages is an amplifier having one of the following configurations: common emitter, cascode, common base.

6. Device according to claim 1, wherein the first and the second inductors are sized and adjusted for resonantly operating.

7. Device according to claim 1, wherein the device is at least partially made by integration in a chip of a semiconductor material, and the first and second reciprocally connected inductors form an integrated transformer.

8. Device according to claim 1, wherein the first and second stages and the first and second inductors are sized for operating on said first input signal at radiofrequencies or at the frequencies of millimeter waves.

9. Electronic device comprising:

a first stage provided with a first input for a first input signal, and a first output for a first output signal;

a second stage comprising a second input for a second input signal, a direct current terminal operating as a ground terminal for alternating current signals, and a second output for a second output signal;

a first inductor connected to the first output and the direct current terminal so that the first and second stages share a direct current; and a second inductor mutually coupled to the first inductor and connected to the second input in order to output the second input signal as a function of the first output signal, wherein the first and second stages and the first and second inductors are sized for operating on said first input signal at radiofrequencies or at the frequencies of millimeter waves, wherein said device is a wireless signal transmitter, and wherein the first stage comprises a voltage-controlled oscillator and the second stage comprises a power amplifier.

10. Device according to claim 8, wherein said device is a wireless signal receiver, and the first and second stages form a low noise amplifier.

11. Electronic device comprising:

a first stage provided with a first input for a first input signal, and a first output for a first output signal;

a second stage comprising a second input for a second input signal, a direct current terminal operating as a ground terminal for alternating current signals, and a second output for a second output signal;

a first inductor connected to the first output and the direct current terminal so that the first and second stages share a direct current;

a second inductor mutually coupled to the first inductor and connected to the second input in order to output the second input signal as a function of the first output signal;

at least a third stage comprising a third input for a third input signal and a further direct current terminal operating as a ground terminal for alternating current signals;

a third inductor connected to the second output and to the further direct current terminal so that the second stage and the at least one third stage share the direct current; and a fourth inductor mutually coupled to the third inductor and connected to the third input in order to output the third input signal as a function of the second output signal.

12. Device according to claim 1, further comprising:

an input transformer connected to the first input of the first stage for supplying the first input signal from an input signal;

an output transformer connected to the second output of the second stage for supplying an output signal from the second output signal.

13. An electronic circuit comprising:

a first stage including a first input and a first output;

a second stage including a second input, a direct current terminal operating as a ground terminal for alternating current signals, and a second output;

a first inductor connected between the first output and the direct current terminal so that the first and second stages share a direct current; and a second inductor magnetically coupled to the first inductor and connected to the second input, wherein the first stage and/or the second stage has a differential configuration.

14. An electronic circuit as defined in claim 13, further comprising:

a third stage including a third input, an additional direct current terminal operating as a ground terminal for alternating current signals, and a third output;

a third inductor connected between the second output and the additional direct current terminal so that the second stage and the third stage share the direct current; and a fourth inductor magnetically coupled to the third inductor and connected to the third input.

15. An electronic circuit as defined in claim 13, wherein the first inductor includes a center tap and wherein the center tap of the first inductor is connected to the direct current terminal.

16. An electronic circuit as defined in claim 13, wherein a capacitor is connected between the direct current terminal and ground.

17. An electronic circuit as defined in claim 13, wherein the second inductor includes a center tap and wherein the center tap of the second inductor is connected to a bias voltage.

18. An electronic circuit as defined in claim 13, wherein the first output comprises differential outputs and wherein the first inductor is connected between the differential outputs of the first stage.

19. An electronic circuit as defined in claim 13, wherein the second input comprises differential inputs and wherein the second inductor is coupled between the differential inputs of the second stage.

20. An electronic circuit as defined in claim 13, wherein the first output comprises differential outputs, wherein the first inductor is connected between the differential outputs of the first stage and is provided with a center tap acting as a virtual ground terminal for the alternating current signals, and wherein the direct current terminal is connected to the virtual ground terminal.

21. An electronic circuit as defined in claim 13, wherein the first stage and/or the second stage comprises a differential amplifier.

22. An electronic circuit as defined in claim 13, wherein the first stage and/or the second stage comprises a differential cascode amplifier.

23. An electronic circuit as defined in claim 13, wherein the first stage and/or the second stage comprises a common base differential amplifier.

24. An electronic device as defined in claim 13, wherein the first stage comprises a common base differential amplifier and the second stage comprises a cascode differential amplifier.

25. An electronic device as defined in claim 14, wherein the first, second and third stages comprise differential amplifiers.

26. An electronic device as defined in claim 13, wherein the first stage comprises a voltage-controlled oscillator and the second stage comprises a power amplifier.

27. An electronic device as defined in claim 13, further comprising an input transformer coupled to the first input of the first stage and an output transformer coupled to the second output of the second stage.

* * * * *

UNITED STATES PATENT AND TRADEMARK OFFICE
CERTIFICATE OF CORRECTION

PATENT NO. : 8,803,614 B2
APPLICATION NO. : 13/604443
DATED : August 12, 2014
INVENTOR(S) : Giammello et al.

Page 1 of 1

It is certified that error appears in the above-identified patent and that said Letters Patent is hereby corrected as shown below:

In the Specification:

Column 5, Line 36, "$S_{OU1}$" should read --$S_{OU2}$--.

Signed and Sealed this
Twenty-first Day of October, 2014

Michelle K. Lee
*Deputy Director of the United States Patent and Trademark Office*